United States Patent [19]

Sylvia et al.

[11] Patent Number: 4,760,242
[45] Date of Patent: Jul. 26, 1988

[54] FUSED EYELETTING MACHINE

[75] Inventors: Frank Sylvia, Columbia; Francis V. Bugg, Towson; John B. Holdway, College Park, all of Md.

[73] Assignee: Pace Incorporated, Laurel, Md.

[21] Appl. No.: 926,845

[22] Filed: Nov. 3, 1986

[51] Int. Cl.$^4$ .......................... B23K 11/32; H05B 1/00
[52] U.S. Cl. .............................. 219/150 V; 219/86.22; 227/51
[58] Field of Search ................ 219/150 V, 86.22, 152, 219/161, 86.81; 74/520; 227/51, 112; 83/631

[56] References Cited

U.S. PATENT DOCUMENTS

| | | | |
|---|---|---|---|
| 1,331,568 | 2/1920 | Jones | 219/150 V |
| 1,345,679 | 7/1920 | Kobert | 219/150 V |
| 3,739,141 | 6/1973 | Siegel | 219/150 V |
| 3,940,590 | 2/1976 | Young et al. | 219/150 V |
| 4,074,846 | 2/1978 | Stoiber | 227/51 |
| 4,480,170 | 10/1984 | Kondou et al. | 219/161 X |
| 4,582,238 | 4/1986 | Bennett et al. | 227/51 X |

FOREIGN PATENT DOCUMENTS 693047 6/1953 United Kingdom .................. 74/520

Primary Examiner—E. A. Goldberg
Assistant Examiner—C. M. Sigda
Attorney, Agent, or Firm—Gerald J. Ferguson, Jr.

[57] ABSTRACT

A machine for setting eyelets and the like in printed circuit boards includes a generally U-shaped frame having a pair of spaced-apart support arms defining a workpiece receiving zone therebetween, a first tool movably mounted in one of the support arms, and a second tool fixedly mounted in the other support arm and axially aligned with the first tool. An adjustable torque screw is connected to the first tool for moving the first tool into aligned contact with the second tool at a pre-determined eyelet setting pressure. The adjustable torque screw insures that the eyelet setting pressure does not exceed the pre-determined eyelet setting pressure despite continued rotation of the adjustable torque screw.

12 Claims, 2 Drawing Sheets

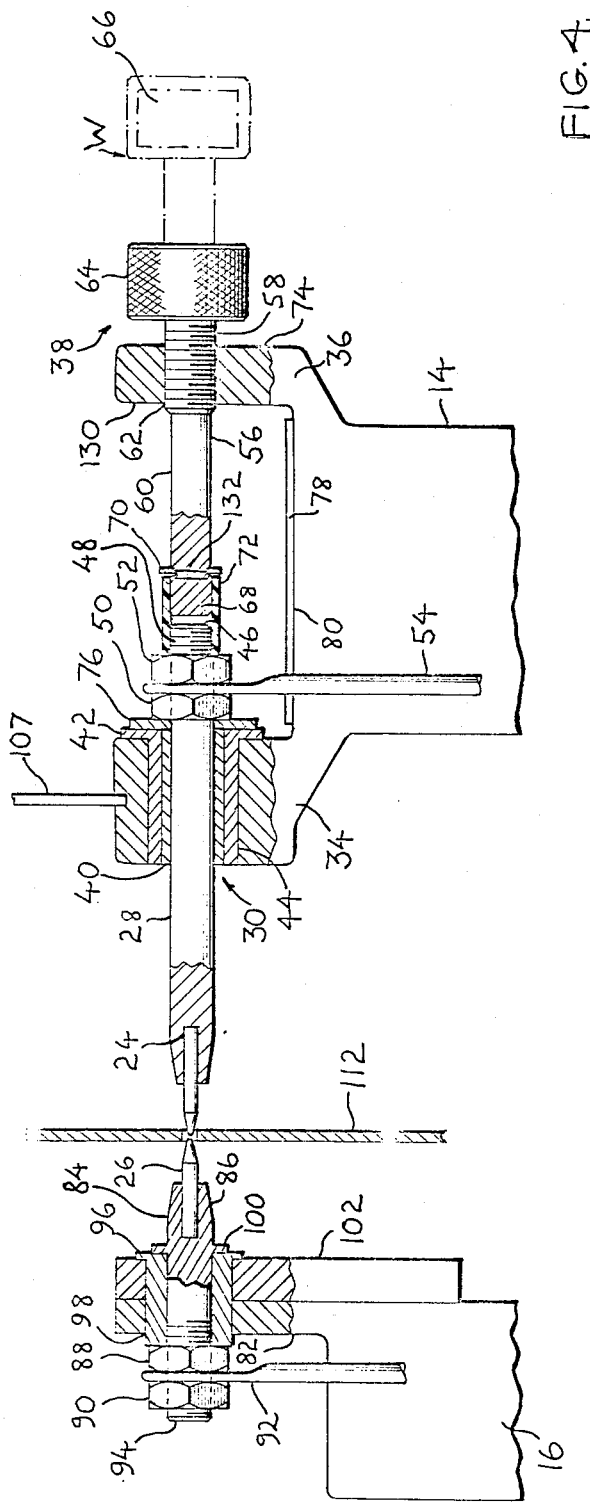
FIG. 2
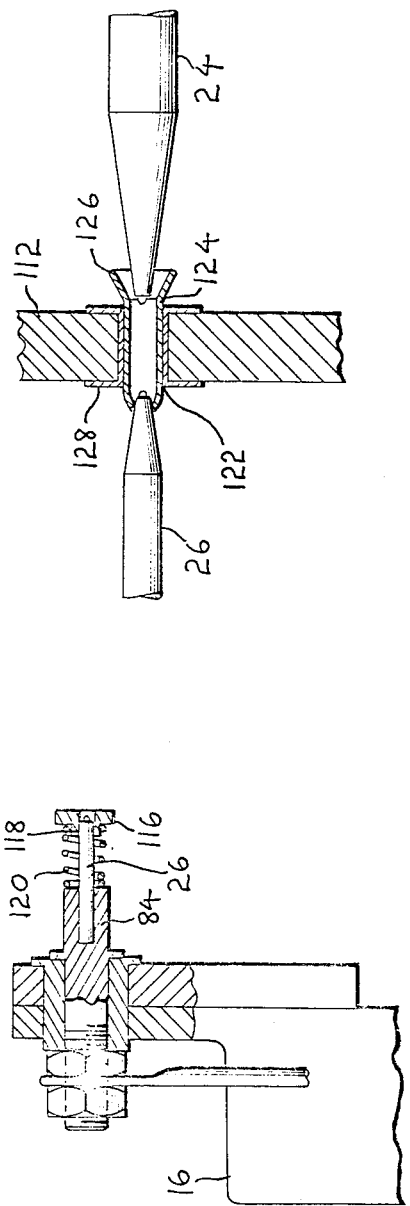
FIG. 4
FIG. 3

FUSED EYELETTING MACHINE

This application is a continuation of Ser. No. 679,896, filed Dec. 10, 1984, now abandoned.

The present invention relates to an eyeletting machine, and more particularly to a manually actuated fused eyeletting machine capable of cold and fused setting of eyelets and funnelets to printed circuit boards.

BACKGROUND OF THE INVENTION

The present invention constitutes an improvement over the fused eyeletting machines disclosed in U.S. Pat. Nos. 3,739,141 and 3,940,590 and in U.S. patent application Ser. No. 583,219 filed Oct. 24, 1984, now U.S. Pat. No. 4,584,460. The disclosures of the above-identified U.S. patents and U.S. patent application are incorporated herein by reference.

U.S. Pat. No. 3,739,141 discloses a fused eyeletting machine having a C-shaped frame, with the upper arm of the frame housing an upper tool, and the lower arm housing a resilient support structure for a lower tool which enables the eyelet setting pressure to be pre-determined. The upper tool is brought into contact with the lower tool by means of a toggle arrangement which is pivoted to the upper arm of the frame.

U.S. Pat. No. 3,940,590 describes an improved version of the machine disclosed in '141 patent. In the machine described in the '590 patent, the upper arm of the C-shaped frame terminates in a pair of spaced-apart tool support members, and a double stop toggle mechanism is mounted between those support members for actuating movement of the upper tool with respect to the lower tool.

The '219 pending U.S. application describes a further improved fused eyeletting machine which utilizes a novel and simplified support structure for resiliently biasing the lower tool to exert a pre-determined force against which the upper tool acts during the eyelet setting operation. As with the machines described in the '141 and '590 U.S. patents, the upper tool is actuated by means of a toggle arrangement.

One of the disadvantages associated with the structures described above arises from the use of a toggle arrangement for actuating movement of one of the tools towards and away from the other tool. In those toggle arrangements, the stroke length is fixed so that difficulties in operation sometimes arise when boards of different thicknesses or eyelets of different lengths are utilized. These difficulties arise especially in the circuit board repair industry where circuit boards and eyelets of various thicknesses and lengths are encountered. In light of this, care must be taken by the machine operator in each eyelet setting operation to achieve the desired eyelet setting and fusing on the board without crushing the board or distorting the eyelets.

A further problem which arises from the use of toggle actuating arrangements is that most toggle mechanisms are manufactured according to low tolerance specifications, so that difficulties are encountered in achieving accurate and repeatable alignment of the upper and lower tools each time the toggle arrangement is used. This, in turn, gives rise to possible distortion of the eyelets as they are pressed into contact with the board prior to fusing, which in turn impairs the quality of the fused eyelet.

It is therefore a primary object of the present invention to provide an improved eyeletting machine capable of use with equal facility on eyelets and funnelets of different sizes and on printed circuit boards of different thicknesses.

It is another object of the present invention to provide an eyeletting machine which utilizes a novel and simplified tool moving arrangement whereby the eyelet setting tools are brought into aligned contact with each other at a pre-determined eyelet setting pressure, which pressure can not be exceeded despite continued operation of the tool moving arrangement after the pre-determined pressure has been reached.

SUMMARY OF THE INVENTION

According to one aspect of the present invention, there is provided a machine for setting eyelets and the like, comprising a generally U-shaped frame having a pair of spaced-apart support arms defining a workpiece receiving zone therebetween. A first tool is movably mounted in one of the support arms, and a second tool is fixedly mounted in the other of the support arms so that the second tool is axially opposed to the first tool. A tool moving means is connected to the first tool for moving the first tool into aligned contact with the second tool at a pre-determined eyelet setting pressure, with the tool moving means including an adjustable torque limiting means for insuring that the pre-determined eyelet setting pressure is not exceeded upon continued operation of the tool moving means.

According to another aspect of the present invention, there is provided a workpiece suspending arrangement for vertically suspending the workpiece into the workpiece receiving zone between the support arm of the U-shaped frame. This arrangement enables the workpiece to be suspended vertically next to the first and second tools, and leaves the operator free to finally position the workpiece relative to the first and second tools while actuating the tool moving means to bring the first tool into contact with the eyelet to be fused in the workpiece.

BRIEF DESCRIPTION OF THE DRAWINGS

The invention will now be described in more detail with reference to the accompanying drawings, in which:

FIG. 2 is a partial cross-sectional view taken along the line 2—2 of FIG. 1;

FIG. 3 is a partial cross-sectional view of an alternative embodiment;

FIG. 4 is an enlarged cross-sectional view of a printed circuit board and an eyelet being set therein.

DETAILED DESCRIPTION OF THE INVENTION

Figure 1:
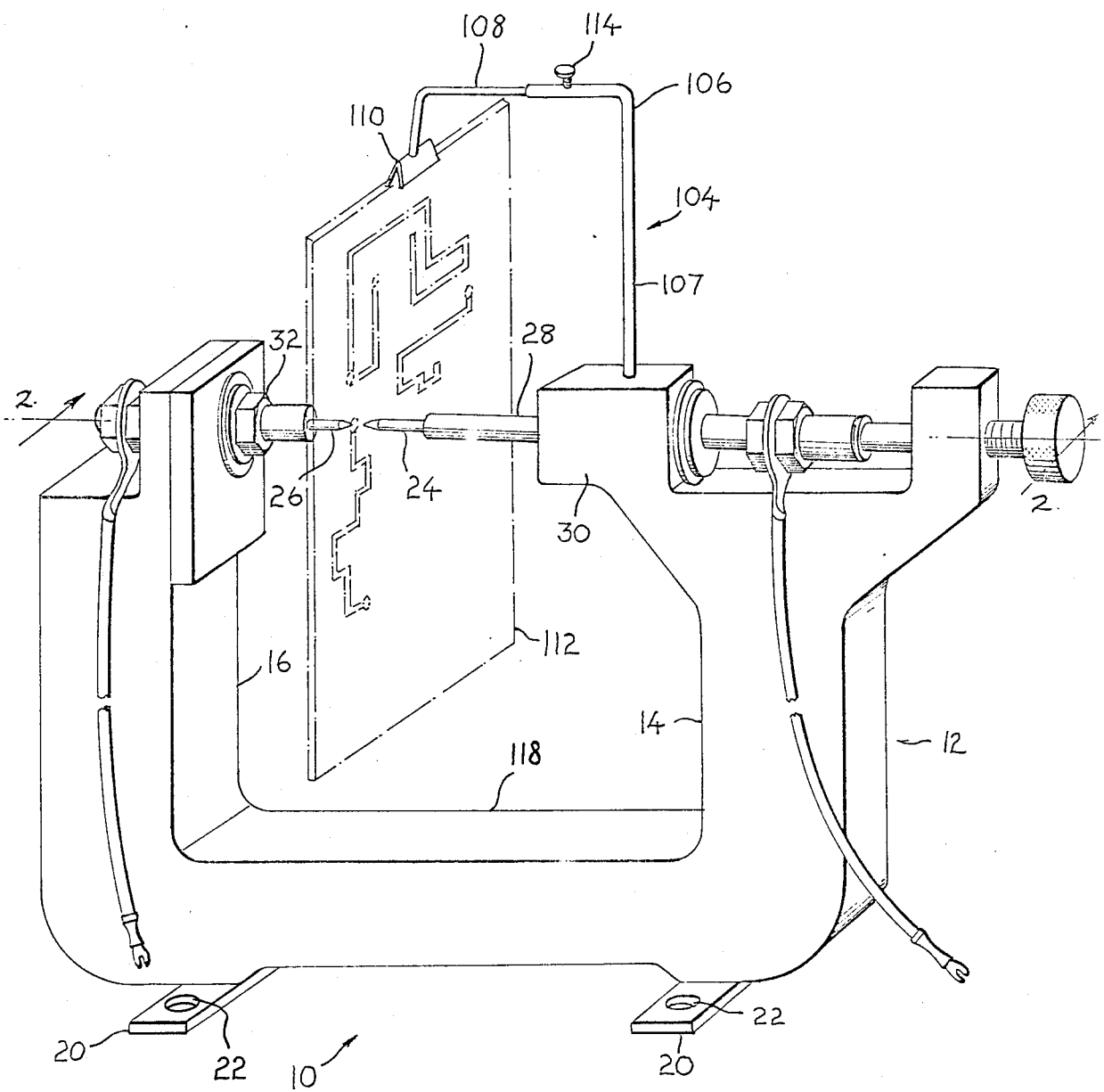
FIG. 1 is a side perspective view of the machine of the present invention.

Referring to FIG. 1, there is shown a machine, generally referenced 10, for setting eyelets and the like in printed circuit boards. The machine 10 has a U-shaped frame 12 which is suitably a cast frame. The frame has a pair of spaced-apart support arms 14, 16 connected by a base section 18. The base section 18 is preferably provided with feet members 20 which support the frame, and also enable the machine to be secured to a work table through apertures 22.

Mounted on the opposing support arms 14, 16 of the frame is a first tool 24 and a second tool 26. The first tool 24 is held in a mandrel 28 which is movably supported in a first tool support structure 30, and the second tool 26 is fixedly mounted in a second tool support structure 32. As shown in FIG. 2, the upper portion of the support arm 14 terminates in a pair of spaced-apart tool support posts 34, 36. The support post 34 houses the first tool support structure 30, and the support post 36 supports an adjustable torque screw 38, which is described in more detail below.

Referring to the first tool support structure 30, the mandrel 28 is slidably housed inside a cylindrical support member 40 which, together with an annular insulator bushing 42, is press fitted in a cylindrical aperture 44 in the support post 34. End 46 of the mandrel 28 has a threaded portion 48 having thereon a pair of nuts 50, 52, and an electrical cable 54 is secured between the nuts. It will be seen, therefore, that the principal purpose of the annular insulator bushing 42 is to electrically insulate the cable 54 from post 34 and frame 12.

The adjustable torque screw 38, which is supported in the support post 36, includes a shaft 56 having a threaded portion 58 and an unthreaded portion 60. The threaded portion 58 is threadably received in a threaded aperture 62 in the post 36, and the threaded aperture 62 is positioned in post 36 such that the shaft 56 and the mandrel 28 are axially aligned with each other, as shown in FIG. 2. The adjustable torque screw 38 has a handle 64 with an adjustable torque mechanism 66 provided internally of the handle, and may be of the type supplied by Jergens, Inc. of Cleveland, Ohio, U.S.A. The adjustable torque mechanism 38 in essence comprises an internal slip-clutch adjustable to a predetermined force. A force beyond the predetermined amount causes the clutch to slip and thereby prevents more force from being applied. The handle is fixedly mounted to the threaded portion 58, so that rotation of the handle results in rotation of the shaft 56. A swivel pad 68 is mounted on the remote end of the unthreaded portion 60, and a stop clip 70 is mounted on the shaft 56 in a region of reduced diameter between the unthreaded portion 60 and the swivel pad 68. A piece of flexible plastic tubing 72 is stretch fitted over the swivel pad 68 and end 46 of the mandrel 28 between nut 52 and stop clip 70 in order to connect the mandrel 28 and the adjustable torque screw 38 together. The significance of this connection is discussed in more detail below. In order to further insure complete insulation between the frame 12 and the electric cable 54, an insulating ring 76 is provided between the nut 50 and the annular insulator bushing 42, and an insulating pad 78 is provided on section 80 extending between support posts 34 and 36.

As will be seen from FIG. 2, the upper portion of support arm 16 has an upstanding support member 82 with a cylindrical aperture 84 extending therethrough. The second tool support structure 32 includes a support mandrel 84 which fixedly houses the second tool 26 at one end 86. End 94 of the support mandrel 84 is threaded and is provided with a pair of nuts 88 and 90 with an electric cable 92 clamped therebetween. The support mandrel 84 is received in a cylindrical insulator bushing 96 which is press fitted in a cylindrical aperture 98 in the upstanding support member 82. A portion of enlarged diameter 100 is provided on the support mandrel 84 which abuts against the insulator bushing 96 so that the support mandrel 84 can be firmly mounted in the cylindrical insulator bushing 96 upon tightening of the nuts 88, 90. A support plate 102 may be provided as shown in FIG. 2 to provide additional support for the second tool support structure 32.

FIGS. 1 and 2 also show a workpiece suspending arrangement 104 which consists essentially of an L-shaped member 106 and an adjusting arm 108 which telescopingly receivable within the L-shaped member 106. As shown in FIG. 1, a support means, for example a clip 110, is provided on the end of the adjusting arm 108 for vertically suspending a workpiece 112, typically a circuit board, into the region between the support arms 14, 16 and close to the first and second tools 24, 26. Positioning of the circuit board 112 is accomplished by telescopingly moving the adjusting arm 108 inside the L-shaped member, and when the desired position has been reached, the adjusting arm 108 can be fixed in that position by means of screw member 114. As illustrated, the suspending arrangement 104 is mounted on the support post 34, but could also be mounted elsewhere on the machine, for example, on the upstanding support member 82. In addition, the suspending arrangement 104 may be mounted in the support post 34 so that it can be rotated about the axis of the vertical upstanding portion 107 of the L-shaped member to facilitate swinging the circuit board 112 into and out of the workpiece receiving zone between the support arms 14, 16.

In FIG. 3, there is illustrated an alternative embodiment in which a stripper accessory 116 is provided on the end of the second tool 26. The stripper accessory 116 comprises a plastic annulus 118 with a flat upper surface therein and a helical spring 120 secured to the plastic annulus 118. The stripper accessory 116 fits around the second tool 26 as shown in FIG. 3 with its flat upper surface flush with the tip end of the second tool 26 and the helical spring 120 resting adjacent the top of the support mandrel 84. The purpose of the stripper accessory 116 is to square a workpiece on the second tool 26 so that the eyelet, funnelet, or the like, may be properly aligned on the workpiece prior to being contacted by the first tool 24. During the setting operation, the stripper accessory 116 is forced along the second tool 26, and it is to be noted that the presence of the stripper accessory 116 does not affect actual operation of the tool 24, 26. The stripper accessory 116 may be removed if insufficient space is present on the workpiece.

Operation of the machine of the present invention will now be described with reference to FIG. 4 of the drawings.

In FIG. 4, a workpiece such as a printed circuit board 112 is shown having an eyelet hole 122. A pre-inserted eyelet or funnelet 124 is loosely positioned in hole 122 with its pre-formed head 126 facing towards tool 24. The workpiece 112 and the eyelet 124 are moved to a position between the first and second tools 24, 26, suitably by suspending the workpiece from the clip 110 as shown in FIG. 1. The workpiece 112 is located such that the eyelet 124 is positioned adjacent the second tool 26, and the first tool 24 is advanced towards the pre-formed head 126 of the eyelet 124. By urging the adjustable torque screw 38 from right to left from position W as seen in FIG. 2 threaded portion 58 is brought into threaded engagement with the threaded aperture 62. By continuing to rotate the adjustable torque screw 38 the threaded portion 58 is screwed into the threaded aperture 62 and thereby, advance the second tool 24 into engagement with eyelet 124.

The adjustable torque screw 38 is pre-adjusted to the desired torque limit, which is typically 20 to 60 lbs, for example 32 to 40 lbs, usually about 35 lbs. The rotation of the handle or knob 64 on torque screw 38 is continued until the torque limit is reached and the desired eyeletting pressure is achieved. As the desired eyeletting pressure is reached, upsetting and cold setting of the eyelet 124 occur so that the eyelet is just tight enough not to rotate in hole 122. The eyelet or funnelet 24 is then fused to pad 128 on the printed circuit board 112 by electrically generated heat via heat cables 54 and 92. The sizes of the first and second tools 24, 26 may be varied according to the different sizes of eyelets or funnelets utilized.

When fusing of the eyelet or funnelet 124 has been completed, the first tool 24 is withdrawn from contact with the fused eyelet by rotating the handle 64 in order to unscrew the threaded portion 58 from the threaded aperture 62 and pull the first tool 24 and the mandrel 28 from left to right as seen in FIG. 2 as a result of the connection between the mandrel 28 and the adjustable torque screw 38 by the flexible plastic tubing 72. Rotation of the handle 64 to unscrew the threaded portion 58 from the threaded aperture 62 gives rise to a relatively slow withdrawal of the first tool 24 from the workpiece 112. This withdrawal may be increased when the threaded portion 58 becomes disengaged from the threaded aperture 62 so that the torque screw 38 together with the mandrel 28 of tool 24 can be manually pulled to position W. When position W is reached, the stop clip 70 comes into abutting engagement with the face 130 of the tool support post 36. Hence stop 70 avoids further withdrawal and possible disengagement of the screw 38 from the machine 10. If desired, a spring (not shown) may be placed between face 74 and handle 64 to assist in the movement of the adjustable torque screw 38 towards position W after disengagement from threaded aperture 62.

If it is desired to conduct a further eyelet fusing operation, the workpiece with the inserted eyelet is arranged with respect to the second tool 26, advantageously by suspending from a suspending arrangement 104 as described above. The first tool 24 is advanced into contact with the eyelet by urging the torque screw 38 from right to left as shown in FIG. 2 from position W. At this position of the torque screw 38 is in threaded engagement of the threaded portion 58 with the threaded aperture 62. The handle 64 in direct engagement with torque screw 36 is then rotated to effect gradual advancement of the first tool 24 into contact with the eyelet 128.

The flexible plastic tubing 72 is sized such that the end 46 of the mandrel 28 and the swivel pad 68 remain coupled when the torque screw 38 is pulled towards position W. When the torque screw 38 is rotated in order to advance the first tool 24 towards the second tool 26, the shaft 56 rotates, but the swivel pad 68 does not rotate in view of the swivel pad connection 132. The rotation of the torque screw 38 does not result in the first tool 24 being rotated as it advances towards the workpiece.

It will be appreciated from the above that the machine of the present invention enjoys numerous advantages over prior eyeletting machines. In particular, the present machine utilizes a torque screw arrangement instead of a toggle arrangement for moving the first tool towards or away from the second tool, and this enables the machine to be used for eyelet fusing operations using eyelets of different lengths and/or circuit boards of different thicknesses. In addition, the eyelet setting pressure can be set to a predetermined value with the adjustable torque screw arrangement so that an accurate repeatable eyelet setting pressure can be applied and crushing of the board or distortion of the eyelet is substantially eliminated. Furthermore, by using the adjustable torque screw arrangement of the present invention, the accuracy of the axial alignment of the first and second tools is substantially improved over that which is generally achievable. In addition, the torque screw arrangement of the present application occupies less space thereby enabling the machine to be housed in a compact unit. A further advantage arises from the fact that the second tool is fixedly mounted in the support arm 16, so that it is not necessary to incorporate any biasing mechanism to achieve the desired eyelet setting pressure. As discussed earlier, the eyelet setting pressure is controlled entirely by the first tool moving arrangement which incorporates the adjustable screw device, and this results in a more convenient and less costly machine.

We claim:

1. A fused eyelet machine for setting eyelets such as in printed circuit boards comprising:
    a generally vertically oriented U-shaped frame having first and second spaced-apart support arms defining a workpiece receiving zone therebetween, said workpiece receiving zone being adapted to vertically receive a workpiece therein;
    a first tool movably mounted in said first support arm;
    a second tool fixedly mounted in said second support arm and axially aligned with said first tool;
    tool moving means connected to said first tool for moving said first tool into contact with said second tool to vertically retain a workpiece therebetween, the workpiece being maintained vertically by the influence of gravity,
    a rotatably adjustable torque screw having a threaded shaft with a first and second end and an adjustable torque knob positioned on said first end,
    said adjustable torque knob adapted to rotate on said threaded shaft to a first predetermined eyelet setting pressure of a desired torque limit and, whereby pressure cannot be exceeded despite continued operation of the tool.

2. A fused eyelet setting machine according to claim 1, wherein said rotatably adjustable torque screw threaded shaft having said adjustable torque knob fixed to said first end further comprises means for setting a limit of travel of said adjustable torque screw relative to said first support arm.

3. A machine according to claim 2, wherein said adjustable torque screw includes a withdrawing means for rapidly moving said first tool towards or away from said second tool.

4. A machine according to claim 3, wherein said withdrawing means is comprised of an unthreaded portion extending from a point on said shaft between said first and second ends to said second end.

5. A machine according to claim 4, wherein said adjustable torque screw has a swivel pad mounted at said second end of said shaft.

6. A machine according to claim 1, wherein a stop is mounted near said second end of said shaft for stopping withdrawal of said first tool from said second tool.

7. A machine according to claim 6, and further including a connecting means for connecting together a swivel pad and said first tool.

8. A machine according to claim 7, wherein said connecting means is a piece of flexible plastic tubing in frictional engagement with said swivel pad and said first tool, said frictional engagement being sufficient to enable withdrawal of said first tool from said second tool without said swivel pad becoming disconnected from said first tool.

9. A machine according to claim 1, and further including a workpiece suspending means for vertically suspending a workpiece into said workpiece receiving zone and between said first and second tools.

10. A machine according to claim 9, wherein said suspending means is mounted on one of said support arms.

11. A machine according to claim 1, wherein said first support arm includes first and second spaced-apart tool support posts, a mandrel portion of said first tool being mounted in an aperture in said first tool support post, said tool moving means being mounted in said second tool support post.

12. A fused eyelet setting machine according to claim 2 further comprising:
   a handle fixedly positioned on said first end of said threaded shaft for advancing said first tool in said first support arm until a predetermined eyelet setting pressure limit is reached which is determined by the torque limit which is preset by said rotatable adjustable torque screw knob.

* * * * *